(12) United States Patent
Kim

(10) Patent No.: US 7,645,672 B2
(45) Date of Patent: Jan. 12, 2010

(54) MASK ROM, METHOD FOR FABRICATING THE SAME, AND METHOD FOR CODING THE SAME

(75) Inventor: Heung Jin Kim, Chungcheongbuk-do (KR)

(73) Assignee: Dongbu Electronics, Inc., Seoul (KR)

( * ) Notice: Subject to any disclaimer, the term of this patent is extended or adjusted under 35 U.S.C. 154(b) by 477 days.

(21) Appl. No.: 11/319,789

(22) Filed: Dec. 29, 2005

(65) Prior Publication Data
US 2006/0194394 A1    Aug. 31, 2006

(30) Foreign Application Priority Data
Dec. 30, 2004    (KR)    ........................ 10-2004-0116149

(51) Int. Cl.
*H01L 21/8236* (2006.01)
(52) U.S. Cl. ................ 438/276; 438/282; 257/E21.671
(58) Field of Classification Search ................ 438/130, 438/276, 282; 257/E21.671
See application file for complete search history.

(56) References Cited

U.S. PATENT DOCUMENTS 5,393,233 A * 2/1995 Hong et al. ................. 438/289

FOREIGN PATENT DOCUMENTS

KR    10-2003-0018222 A    3/2003

* cited by examiner

*Primary Examiner*—Chandra Chaudhari
(74) *Attorney, Agent, or Firm*—McKenna Long & Aldridge LLP

(57) ABSTRACT

A mask ROM, a method for fabricating the same and a method for coding the same are disclosed. The method for forming the mask ROM maximizes packing density and integration of a device. The mask ROM includes a semiconductor substrate having a device isolation region and an active region, BN junction regions formed in predetermined portions of the active region, an insulating film, first electrode layers formed on predetermined portions of the insulating film, spacers formed at sides of the first electrode layers, and second electrode layers between the spacers.

3 Claims, 8 Drawing Sheets

MASK ROM, METHOD FOR FABRICATING
THE SAME, AND METHOD FOR CODING
THE SAME

This application claims the benefit of Korean Patent Application No. 10-2004-0116149, filed on Dec. 30, 2004, which is hereby incorporated by reference for all purposes as if fully set forth herein.

BACKGROUND OF THE INVENTION

1. Field of the Invention

The present invention relates to a semiconductor device, and more particularly, to a mask ROM, a method for fabricating the same and a method for coding the same. The method for forming the mask ROM maximizes integration and packing density of a device.

2. Discussion of the Related Art

Generally, a flat ROM device is made by a method for fabricating a semiconductor device. That is, the flat ROM device is so-named because its Bit-Line and Word-Line are formed at a step lower than that of other memory devices. A mask ROM is made as a desired cell that is selectively coded with '0' or '1' by a mask process.

A related art mask ROM and a method for fabricating the same will be described.

FIG. 1A is a sectional view illustrating a related art mask ROM viewed from a Bit-Line direction, and FIG. 1B is a sectional view illustrating a related art mask ROM viewed from a Word-Line direction.

As shown in FIG. 1A, in the related art mask ROM viewed from a Bit-Line direction, a plurality of Word-Lines comprise a polysilicon gate electrode layer 13a and a silicide layer 14a patterned at a predetermined width on a substrate 10 provided with a gate oxide film 12. An insulating film 15 is formed between the patterns.

As shown in FIG. 1B, in the related art mask ROM viewed from a Word-Line direction, a gate oxide film 12 is formed on a substrate 10 defined by buried N doped (BN) junction regions 11 formed at predetermined portions. A polysilicon layer 13 and a silicide layer 14 are sequentially formed on the gate oxide film 12. The gate oxide film 12 is relatively thicker than any other portions. The BN junction regions 11 buried on the substrate 10 serve as Bit-Lines.

The related art mask ROM is fabricated as follows.

First, a device isolation region (not shown) is formed on a semiconductor substrate 10 by a local oxidation of silicon (LOCOS) process or a shallow trench isolation (STI) process. Also, a region other than the device isolation region is defined as an active region.

After a well is formed in the active region, a nitride film (not shown) is deposited on the semiconductor substrate 10. After a photoresist pattern is coated and predetermined portions of the photoresist pattern are removed, the nitride film is patterned such that its width is the same width as the photoresist pattern. Ions are implanted into a predetermined portion on the semiconductor substrate 10 using the nitride film as a mask to define impurity ion regions. The defined impurity ion regions are BN junction regions 11.

Subsequently, after the nitride film is removed, the semiconductor substrate 10 is cleaned, and a gate oxide film 12 is formed on the semiconductor substrate 10. The gate oxide film 12 formed on the BN junction regions 11 is thicker than other portions of the gate oxide film 12.

Next, a polysilicon layer 13 is deposited on the gate oxide film 12 and then selectively removed to form a gate electrode layer 13a.

The gate electrode layer 13a undergoes reoxidation to form a silicide layer 14a. Each structure that comprises the gate electrode layer 13a and the silicide layer 14a serves as a Word-Line.

Subsequently, regions between the structures that comprise the gate electrode layer 13a and the silicide layer 14a are filled with the insulating film 15.

Then, lightly doped drain (LDD) regions and heavily doped junction regions are formed by ion implantation.

In the process of fabricating the related art flat cell type mask ROM device, which may be a flat cell type mask ROM, the BN junction regions 11 used as Bit-Lines are formed by annealing after implanting ions into the active region.

As shown in FIG. 1B, regions between the BN junction regions 11 are channels of a cell transistor, and the BN junction regions 11 serve as source and drain regions.

The BN junction regions 11 are formed with a long depth in a flat ROM device. Resistance between lines of the BN junction regions 11 impedes driving of a cell. Therefore, each BN junction region 11 requires a proper depth and a proper line width to maintain resistance at a proper value. However, with the trend towards decreased cell sizes, it is difficult to obtain a proper depth and a proper line width due to a required channel margin.

SUMMARY OF THE INVENTION

Accordingly, the present invention is directed to a mask ROM, a method for fabricating the same and a method for coding the same, which substantially obviate one or more problems due to limitations and disadvantages of the related art.

An advantage of the present invention is to provide a mask ROM, a method for fabricating the same and a method for coding the same, in which a method for forming the mask ROM maximizes integration and packing density of a device.

Additional features and advantages of the invention will be set forth in the description which follows, and will become apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described, a mask ROM includes a semiconductor substrate having a device isolation region and an active region, BN junction regions formed in predetermined portions of the active region, an insulating film formed on a surface of the substrate, first electrode layers formed on predetermined portions of the insulating film, spacers formed at sides of the first electrode layers, and second electrode layers filled between the spacers.

In another aspect of the present invention, a method for fabricating a mask ROM includes depositing an insulating film on a semiconductor substrate having a device isolation region and an active region, forming BN junction regions by implanting impurity ions into predetermined portions of the substrate, forming first electrode layers by depositing polysilicon on the insulating film and selectively removing the polysilicon, forming spacers at sides of the first electrode layers, and forming second electrode layers between the spacers.

In another aspect of the present invention, a method for coding a mask ROM includes depositing a base insulating film on the mask ROM, forming base insulating film patterns by selectively removing the base insulating film, and performing a code photolithographic process and an impurity ion implantation process onto portions of the mask ROM exposed by the base insulating film patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings:.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 1A:
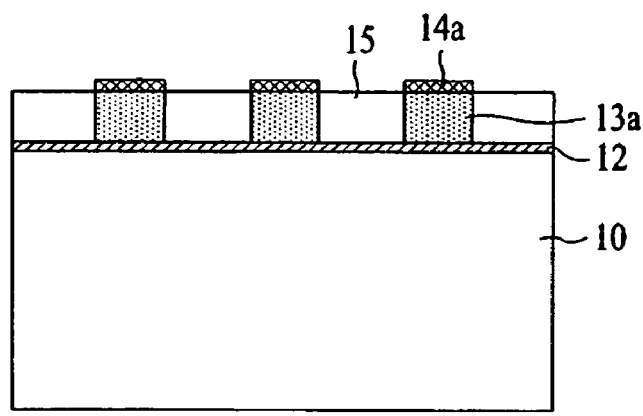
FIG. 1A is a sectional view illustrating a related art mask ROM viewed from a Bit-Line direction;.
Figure 1B:
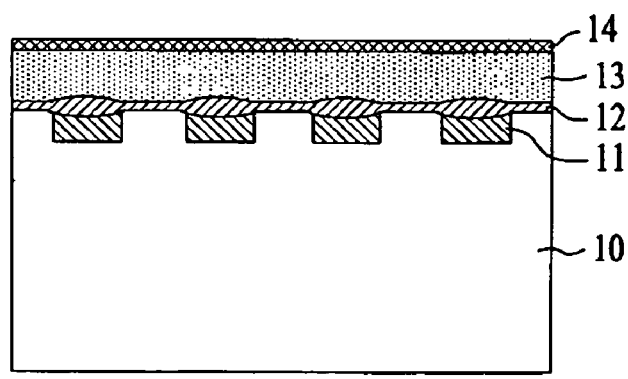
FIG. 1B is a sectional view illustrating a related art mask ROM viewed from a Word-Line direction.
Figure 2A:
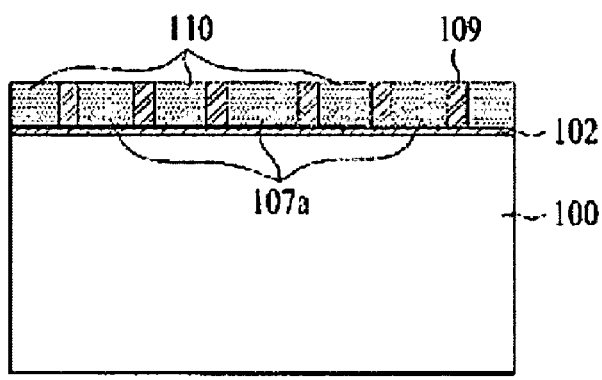
FIG. 2A is a sectional view illustrating a mask ROM of the present invention, viewed from a Bit-Line direction.
Figure 2B:
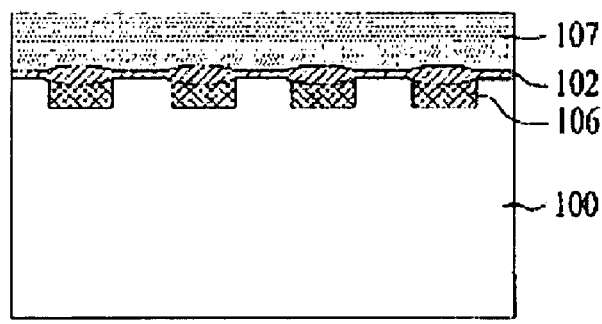
FIG. 2B is a sectional view illustrating a mask ROM of the present invention, viewed from a Word-Line direction.

FIG. 2A is a sectional view illustrating a mask ROM according to an exemplary embodiment of the present invention, viewed from a Bit-Line direction, and FIG. 2B is a sectional view illustrating the mask ROM, viewed from a Word-Line direction.

As shown in FIGS. 2A and 2B, a mask ROM includes a substrate 100 defined by an isolation oxide film (not shown) and an active region, BN junction regions 106 formed in predetermined portions of the active region, a buffer oxide film 102 formed on an entire surface of the substrate 100, first electrode layers 107a formed on predetermined portions of the buffer oxide film 102, spacers 109 formed at sides of the first electrode layers 107a, and second electrode layers 110 filled between the spacers 109.

The Word-Line, as shown in FIG. 2A comprises the first electrode layers 107a and the second electrode layers 110 around the spacers 109. Also, as shown in FIG. 2B, the Bit-Line comprises the BN junction regions 106 in the semiconductor substrate 100. The buffer oxide film 102 and the first electrode layer 107 are formed on the entire surface of the substrate 100 including the BN junction regions 106, and may be formed on an entire surface of the substrate.

Process steps of fabricating the mask ROM according to an exemplary embodiment of the present invention, viewed from a Bit-Line direction and a Word-Line direction will be described with reference to FIG. 3A to FIG. 3H.

A device isolation region is formed on a predetermined portion of a semiconductor substrate 100 by a LOCOS process or a STI process to define the device isolation region and an active region. A region other than the device isolation region is defined as the active region.

Subsequently, impurity ions are implanted to a predetermined portion of the active region to form a well.

Figure 3A:
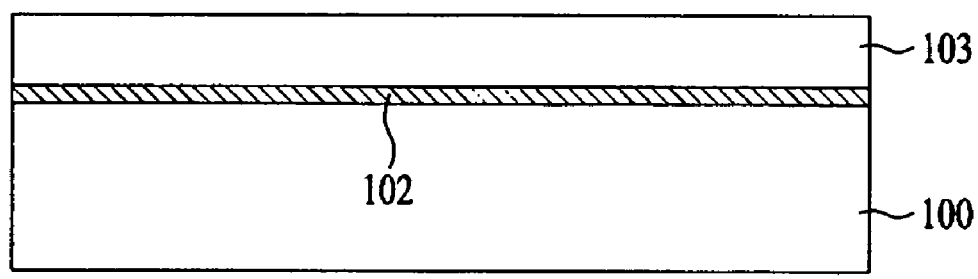
FIG. 3A to FIG. 3H are sectional views illustrating a mask ROM fabricated by a method of the present invention, viewed from a Bit-Line direction and a Word-Line direction.

As shown in FIG. 3A, a buffer oxide film 102 is deposited on the substrate 100 and a nitride film 103 is deposited on the buffer oxide film 102.

Figure 3B:
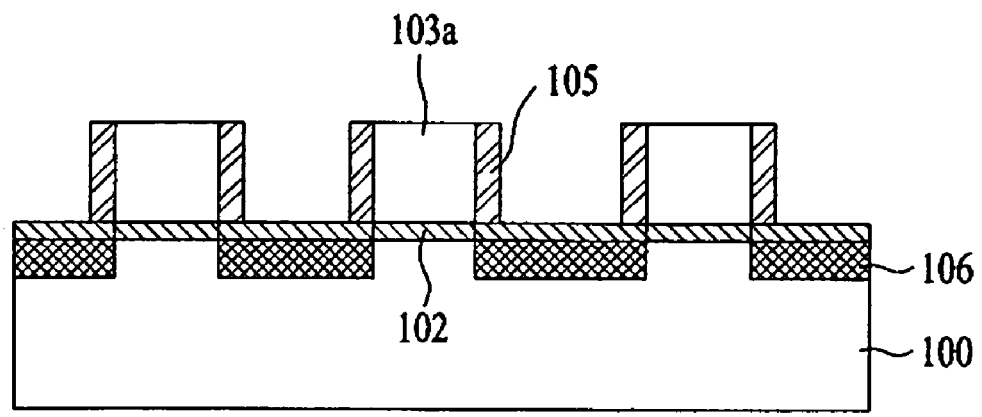

Subsequently, as shown in FIG. 3B, the nitride film 103 is selectively removed to form first nitride film patterns 103a. Then, an oxide film is deposited on a surface of the substrate 100 including the first nitride film patterns 103a and etched-back to form first sidewall spacers 105 at sides of the nitride film patterns 103a. The oxide film may be formed of tetra ethyl ortho silicate (TEOS).

Next, impurity ions are implanted into the exposed substrate 100 using the first nitride film patterns 103a and the spacers 105 as masks to form BN junction regions 106. Then, the first sidewall spacers 105 and the nitride film patterns 103a are sequentially removed.

Figure 3C:
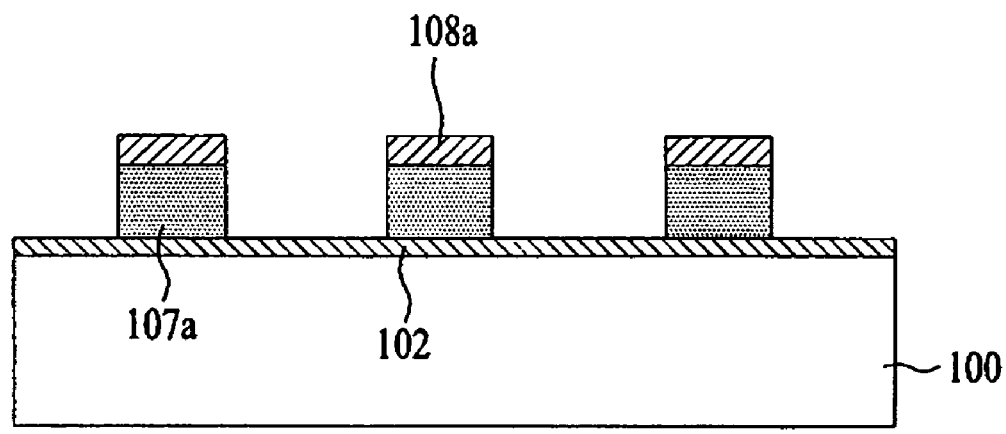
Figure 3D:
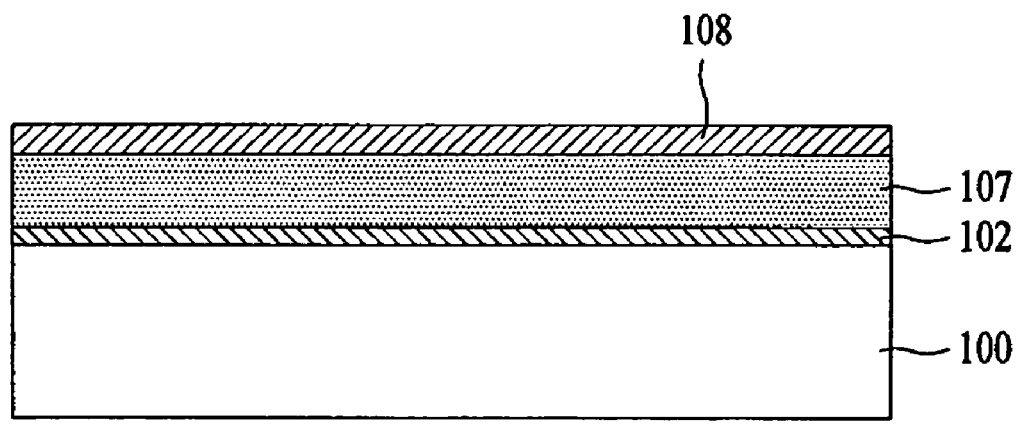

As shown in FIG. 3D, the buffer oxide film 102 is grown by an oxidation process. Portions of the buffer oxide film 102 on the BN junction regions 106 may be thicker than other portions of the buffer oxide film 102 (see FIG. 2B). Subsequently, a polysilicon layer 107 and a cap insulating film 108 are sequentially formed on the buffer oxide film 102.

As shown in FIG. 3C, the cap insulating film 108 and the polysilicon layer 107 are selectively removed to form first electrode layers 107a and cap insulating film patterns 108a having the same width as each other.

Figure 3E:
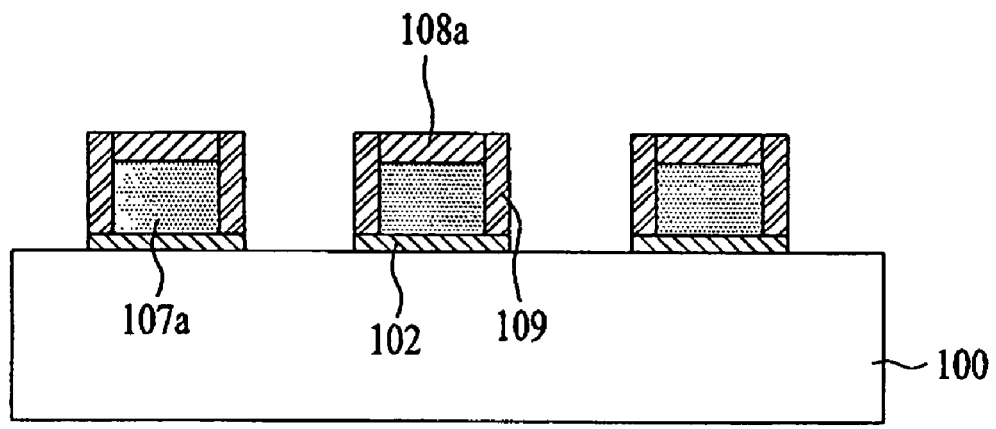
Figure 3F:
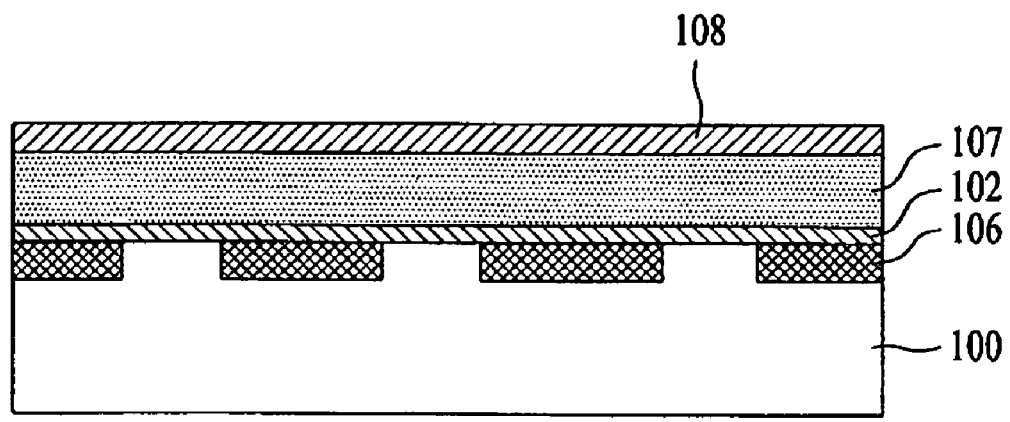

Next, as shown in FIG. 3E, an insulating film is deposited on a surface of the substrate 100 including the first electrode layers 107a and the cap insulating film patterns 108a. The insulating film is then etched back to form second sidewall spacers 109 at sides of the first electrode layers 107a and the cap insulating film patterns 108a.

Figure 3G:
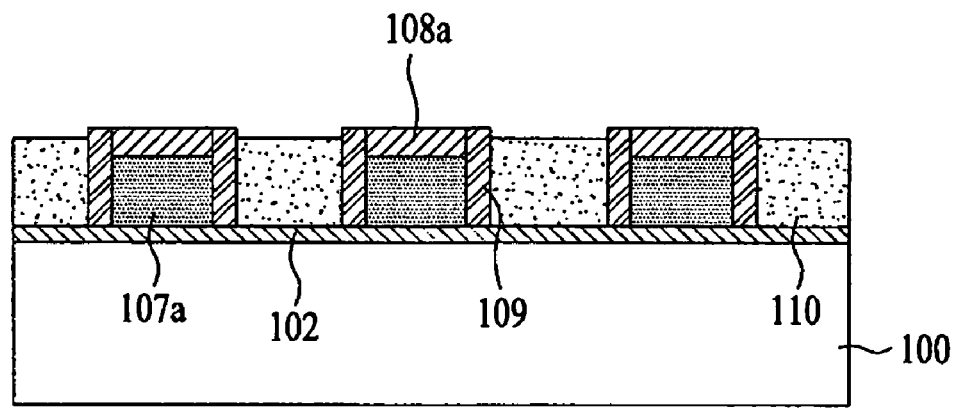
Figure 3H:
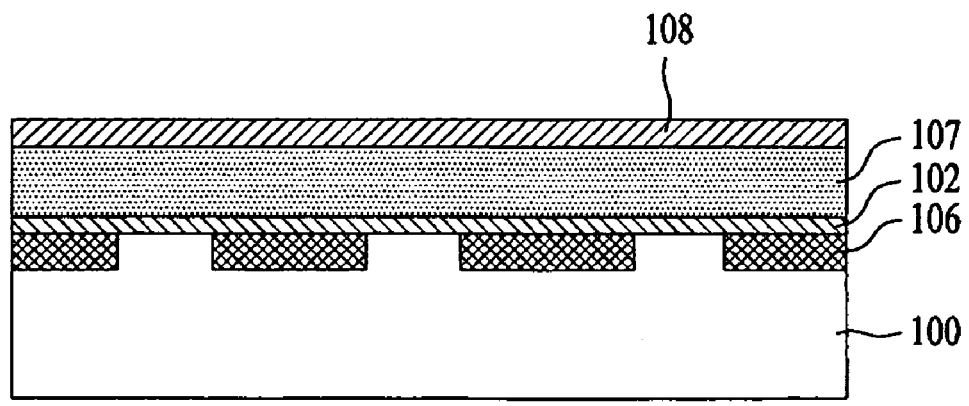

As shown in FIG. 3G, the surface of the substrate 100 undergoes oxidation to form the buffer oxide film 102 on the surface of the substrate 100. Regions between the second sidewall spacers 109 are filled with polysilicon. The regions may be partially filled or completely filled with polysilicon. The polysilicon layers are etched back so that the polysilicon layers are substantially level with the first electrode layers 107a to form second electrode layers 110. A cell region is fully opened. Since other logic junction processes may be performed by general processes, their detailed description will be omitted.

Next, coding processes of a mask ROM according to an exemplary embodiment of the present invention will be described with reference to FIG. 3I to FIG. 3L.

Figure 3I:
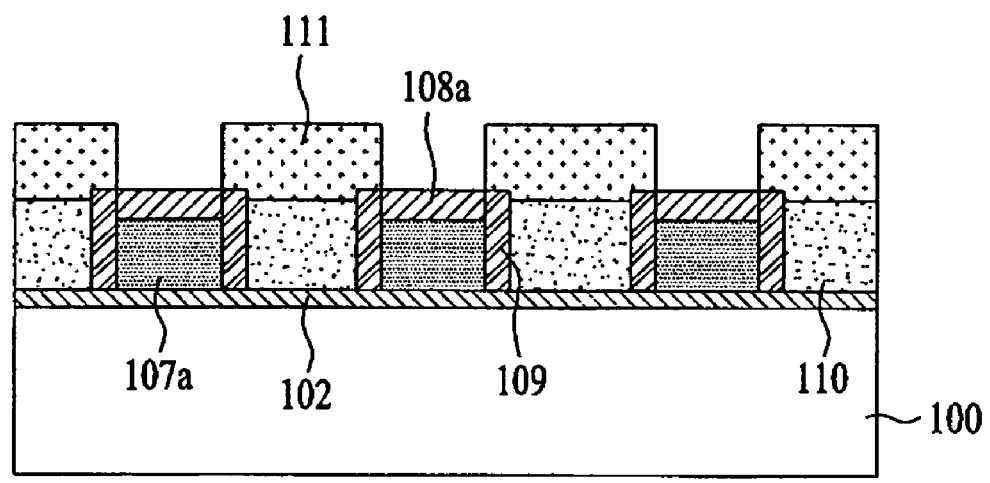
FIG. 3I and FIG. 3J are sectional views illustrating a mask ROM coded by a first coding process.
Figure 3J:
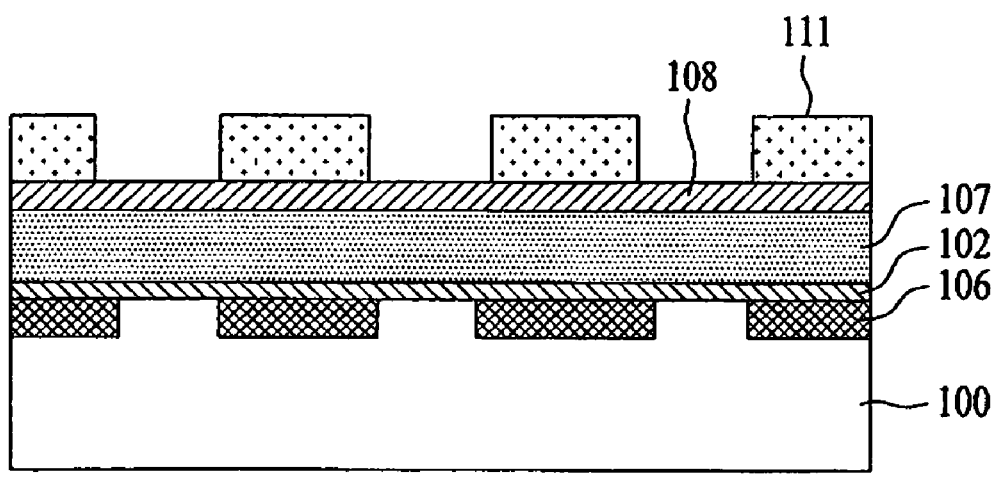

FIG. 3I and FIG. 3J illustrating a mask ROM coded by a first coding process. In the mask ROM having the structure of FIG. 3G in the Bit-Line and the structure of FIG. 3H in the Word-Line, a first base array insulating film is deposited and then selectively removed to form first base array insulating film patterns 111 that expose portions corresponding to the first electrode layers 107a. The first base array insulating film patterns 111 do not expose portions corresponding to the BN junction regions 106.

Subsequently, after a code photolithographic process is performed through the portions exposed by the first base array insulating film patterns 111, impurity ion implantation and cleaning processes are performed.

Figure 3K:
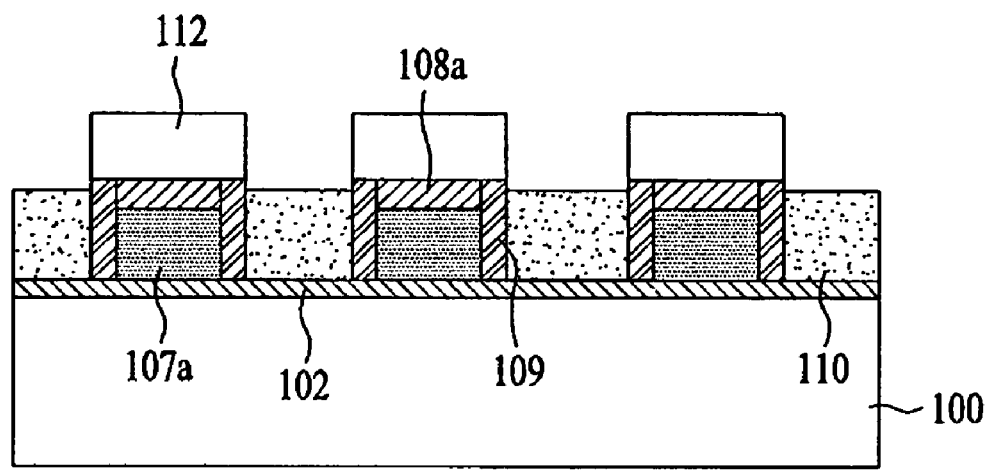
FIG. 3K and FIG. 3L are sectional views illustrating a mask ROM coded by a second coding process.
Figure 3L:
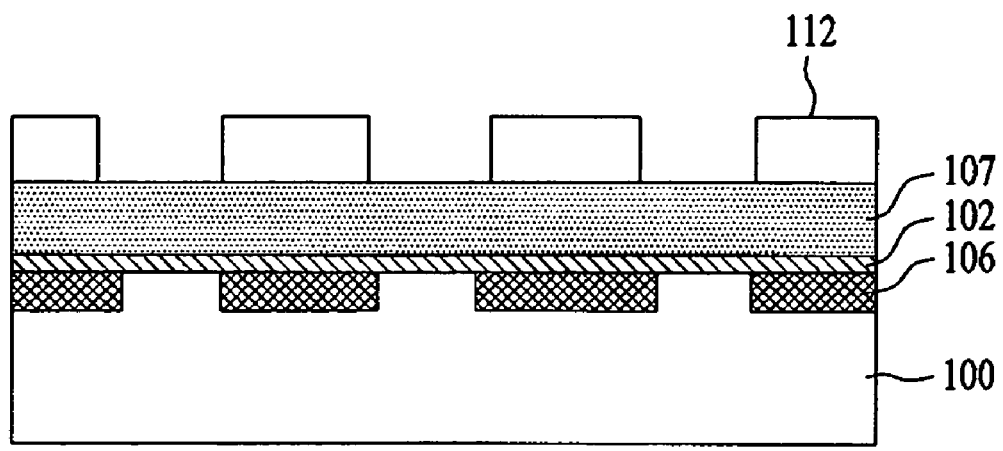

FIG. 3K and FIG. 3L illustrate a mask ROM coded by a second coding process. In the mask ROM having the structure of FIG. 3G in the Bit-Line and the structure of FIG. 3H in the Word-Line, a second base array insulating film is deposited and then selectively removed to form second base array insulating film patterns 112. The cap insulating film 108 in the Word-Line is also removed.

Subsequently, after a code photolithographic process is performed in the first electrode layer 107 through portions exposed by the second base array insulating film patterns 112, impurity ion implantation is performed.

The operation of the a mask ROM according to exemplary embodiments of the present invention follow a reading operation of a general ROM. A voltage of approximately 1.0V is applied to the BN junction regions and a power voltage Vcc is applied to the Word-Line, which is a gate line.

The second electrode layer 110 is not formed by blanket so as to obtain a contact region with a decoder portion at a starting point of the Word-Line and form a logic gate pattern.

In the mask ROM according to exemplary embodiments of the present invention, since the second electrode layers 110 exist between the first electrode layers 107a and the sidewall spacers 109, it is possible to increase density of the mask ROM. As a result, it is possible to increase packing density and integration of the device.

As described above, the mask ROM, the method for fabricating the same, and the method for coding the same according to exemplary embodiments of the present invention have the following advantages.

Since the self-aligned insulating film is controlled at the device isolation region in a cell region, it is possible to minimize the gate-to-gate space of a cell pattern.

Also, since the second electrode layers are formed between the first electrode layers and the sidewall spacers, it is possible to reduce a cell size to about 50% of the size of the related art cell size. As a result, it is possible to remarkably improve packing density and integration of the device.

Also, since the first and second electrode layers can be planarized, it is possible to obtain a flat cell of high density.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a mask ROM comprising:
   depositing an insulating film on a semiconductor substrate having a device isolation region and an active region;
   forming BN junction regions by implanting impurity ions to predetermined portions of the substrate, wherein forming the BN junction regions comprises:
   depositing a nitride film on the insulating film;
   forming nitride film patterns by selectively removing the nitride film;
   forming first sidewall spacers at sides of the nitride film patterns;
   implanting impurity ions into the semiconductor substrate using the nitride film patterns and the first sidewall spacers as masks to form the BN junction regions; and
   removing the nitride film patterns and the spacers;
   forming first electrode layers by depositing polysilicon on the insulating film and selectively removing the polysilicon;
   forming second sidewall spacers at sides of the first electrode layers; and
   forming second electrode layers between the second sidewall spacers.

2. The method of claim 1, wherein the spacers are formed by an etch-back process after the insulating film is deposited on an entire surface of the semiconductor substrate including the first electrode layers.

3. The method of claim 1, wherein the second electrode layers have a height equal to that of the first electrode layers.

* * * * *